United States Patent
Adachi

(10) Patent No.: US 7,902,574 B2
(45) Date of Patent: Mar. 8, 2011

(54) SOLID STATE IMAGE PICKUP DEVICE AND OPERATING METHOD THEREOF

(75) Inventor: Satoru Adachi, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 226 days.

(21) Appl. No.: 11/749,303

(22) Filed: May 16, 2007

(65) Prior Publication Data

US 2007/0278536 A1  Dec. 6, 2007

(51) Int. Cl.
*H01L 27/148* (2006.01)

(52) U.S. Cl. ......... 257/215; 257/239; 257/290; 257/291; 257/292; 257/183.1; 257/184; 257/226; 257/238; 257/E27.154; 257/E27.155; 257/E27.156; 257/E21.456; 257/233; 257/E27.132; 257/E27.133

(58) Field of Classification Search .................. None
See application file for complete search history.

(56) References Cited

U.S. PATENT DOCUMENTS

| | | | | |
|---|---|---|---|---|
| 5,880,494 | A * | 3/1999 | Watanabe | 257/225 |
| 6,069,376 | A * | 5/2000 | Merrill | 257/291 |
| 2003/0178674 | A1* | 9/2003 | Fujita | 257/336 |
| 2004/0217395 | A1* | 11/2004 | Takamura | 257/291 |
| 2006/0154488 | A1* | 7/2006 | Morioka | 438/734 |
| 2007/0023798 | A1* | 2/2007 | McKee | 257/291 |
| 2007/0290242 | A1* | 12/2007 | Katsuno et al. | 257/292 |

FOREIGN PATENT DOCUMENTS

JP  2005-328493  * 11/2005

OTHER PUBLICATIONS

Sedra, Adel S. Microelectronic Circuits, fourth edition, Oxford: Oxford University Press, 1998.*

* cited by examiner

*Primary Examiner* — Minh-Loan T Tran
*Assistant Examiner* — Fei Fei Yeung Lopez
(74) *Attorney, Agent, or Firm* — William B. Kempler; Wade J. Brady, III; Frederick J. Telecky, Jr.

(57) ABSTRACT

This invention provides a type of solid-state image pickup device characterized by the fact that for a solid-state image pickup device with a broad dynamic range, it is possible to suppress the dark current than photoelectrons overflowing from the photodiode, as well as its driving method. Plural pixels are integrated in an array configuration on a semiconductor substrate. Each pixel has the following parts: photodiode (CPD), transfer transistor ($\phi$T), floating diffusion (CFD), accumulating capacitive element (CS), accumulating transistor ($\phi$S), and a reset transistor. During the accumulating period of photoelectric charge, voltage ($\alpha$) over that applied on the semiconductor substrate, or −0.6 V or lower than the voltage applied on the semiconductor substrate, is applied as an OFF potential on the gate electrode of at least one transfer transistor, the accumulating transistor and the reset transistor.

12 Claims, 11 Drawing Sheets

SOLID STATE IMAGE PICKUP DEVICE AND OPERATING METHOD THEREOF

FIELD OF THE INVENTION

The present invention pertains to a type of solid-state image pickup device and its operating method. Especially, the present invention pertains to a CMOS type or CCD type solid-state image pickup device and its operating method.

BACKGROUND OF THE INVENTION

For a CMOS (Complementary Metal-Oxide-Semiconductor) image sensor or CCD (Charge Coupled Device) image sensor, and other image input sensors, since their characteristics have improved, the demand for them in of digital camera applications and camera-equipped cell phone applications has been increasing. For said image sensors, there is a demand for further improvement of characteristics, such as expansion of the dynamic range.

For example, Japanese Kokai Patent Application No. 2003-134396, Japanese Kokai Patent Application No. 2000-165754, Japanese Kokai Patent Application No. 2002-77737, and Japanese Kokai Patent Application No. Hei 5[1993]-90556 disclose solid-state image pickup devices that realize a wider dynamic range. However, for these solid-state image pickup devices, it is difficult to realize a wider dynamic range while maintaining high sensitivity and a high S/N ratio. In order to solve this problem, Japanese Kokai Patent Application No. 2005-328493 discloses a type of solid-state image pickup device.

For the solid-state image pickup device described in Japanese Kokai Patent Application No. 2005-328493, the structure is such that the photoelectric charge overflowing from the photodiode of each pixel is accumulated in the floating diffusion and an electrostatic capacitive element. The signal of each pixel is obtained by the photoelectrons in the diode when the photoelectrons do not overflow, or by both photoelectrons in the photodiode and photoelectrons overflowing from the photodiode when said photoelectrons overflow from the photodiode.

However, for the solid-state image pickup device described in Japanese Kokai Patent Application No. 2005-328493, when it is manufactured in a CMOS process, the dark current component than the photoelectrons overflowing from the photodiode becomes larger, e.g., by 3-4 orders of magnitude, than the desired level. This is undesired for use in accumulating photoelectric charge over a long time, and there is a demand for suppression of this phenomenon.

Sites for generation of the dark current component include the interface just below the gate of the transistor, the side surface of the element-separating insulating film, the portion in contact with the depletion layer on the silicon surface, etc.

A problem to be addressed is the difficulty in suppressing the dark current component than the photoelectrons overflowing from the photodiode in a solid-state image pickup device with a wide dynamic range.

SUMMARY OF THE INVENTION

This and other aspects and features are provided in accordance with one aspect of the present invention by a type of solid-state image pickup device characterized by the following facts: it has plural pixels integrated in an array configuration on a semiconductor substrate; each pixel has the following parts: a photodiode that receives light and generates and accumulates photoelectric charge, a transfer transistor that transfers said photoelectric charge from said photodiode, a floating diffusion that transfers said photoelectric charge via said transfer transistor, an accumulating capacitive element that is connected via said floating diffusion to said photodiode and that at least accumulates the photoelectric charge overflowing from said photodiode in the accumulating operation via said transfer transistor, an accumulating transistor that connects or divides the potentials of said floating diffusion and said accumulating capacitive element, and a reset transistor that is connected to said accumulating capacitive element or said floating diffusion to exhaust the photoelectric charge in said accumulating capacitive element and/or said floating diffusion; during the accumulating period of said photoelectric charge, a voltage over that applied on said semiconductor substrate, or −0.6 V or lower than the voltage applied on said semiconductor substrate, is applied as an OFF voltage level of the transistor on the gate electrode of at least one of said transfer transistor, said accumulating transistor and said reset transistor.

The solid-state image pickup device of an aspect of the present invention has plural pixels integrated in an array configuration on a semiconductor substrate; each pixel has the following parts: a photodiode that receives light and generates and accumulates photoelectric charge, a transfer transistor that transfers said photoelectric charge from said photodiode, a floating diffusion that transfers said photoelectric charge via said transfer transistor, an accumulating capacitive element that is connected via said floating diffusion to said photodiode and at least accumulates the photoelectric charge overflowing from said photodiode in the accumulating operation via said transfer transistor, an accumulating transistor that connects or divides the potentials of said floating diffusion and said accumulating capacitive element, and a reset transistor that is connected to said accumulating capacitive element or said floating diffusion to exhaust the photoelectric charge in said accumulating capacitive element and/or said floating diffusion.

Here, during the accumulating period of said photoelectric charge, a voltage over that applied on said semiconductor substrate, or −0.6 V or lower than the voltage applied on said semiconductor substrate, is applied as an OFF voltage level of the transistor on the gate electrode of at least one of said transfer transistor, said accumulating transistor and said reset transistor.

The solid-state image pickup device of an aspect of the present invention described above, may during the accumulating period of said photoelectric charge, apply a voltage over that applied on said semiconductor substrate, or −0.6 V or lower than the voltage applied on said semiconductor substrate, to the gate electrodes of said transfer transistor, accumulating transistor and reset transistor.

For the aforementioned solid-state image pickup device of the one aspect of present invention, the voltage applied on said gate electrodes may be 0.3 V or higher than the voltage applied on said semiconductor substrate. Also, the voltage applied on said gate electrodes may be 0.8 V or lower than the voltage applied on said semiconductor substrate.

Also, for an aspect of the solid-state image pickup device of the present invention, the gate electrode of at least one of said transfer transistor, said accumulating transistor and said reset transistor may be made of p-type silicon, and, below said gate electrode made of said p-type silicon, an n-type layer may be formed as a channel on the principal surface of the p-type well of said semiconductor substrate, so that an np-type embedded channel structure is formed.

In accordance with an aspect of the invention, in said photodiode, said transfer transistor, said floating diffusion, said accumulating capacitive element, said accumulating transistor, and said reset transistor, an n-type layer may be formed as a channel on the principal surface of the p-type well of said semiconductor substrate to form an np-type embedded channel structure.

In accordance with an aspect of the invention, the gate electrode of at least one of said transfer transistor, said accumulating transistor and said reset transistor may be made of p-type polysilicon; below said gate electrode may be made of p-type polysilicon, a p-type layer may be formed on the principal surface of the p-type well of said semiconductor substrate, and an n-type layer may be formed as a channel in a region deeper than said p-type layer, so that a pnp-type embedded channel structure is formed.

In accordance with an aspect of the invention, in said photodiode, said transfer transistor, said floating diffusion, said accumulating capacitive element, said accumulating transistor, and said reset transistor, a p-type layer may be formed on the principal surface of the p-type well of said semiconductor substrate, and, in a region deeper than said p-type layer, an n-type layer may be formed as a channel to form a pnp-type embedded channel structure.

In accordance with an aspect of the present invention, it also has a driver that works as follows: on the gate electrode of at least one of said transfer transistor, said accumulating transistor and said reset transistor, during the accumulating period of said photoelectric charge, a voltage over that applied on said semiconductor substrate, or –0.6 V or lower than the voltage applied on said semiconductor substrate, is applied as an OFF voltage level.

In accordance with another aspect of the present invention an operating method for solid-state image pickup device is characterized by the following facts: the solid-state image pickup device has plural pixels integrated in an array configuration on a semiconductor substrate; each pixel has the following parts: a photodiode that receives light and generates and accumulates photoelectric charge, a transfer transistor that transfers said photoelectric charge from said photodiode, a floating diffusion that transfers said photoelectric charge via said transfer transistor, an accumulating capacitive element that is connected via said floating diffusion to said photodiode and that at least accumulates the photoelectric charge overflowing from said photodiode in the accumulating operation via said transfer transistor, an accumulating transistor that connects or divides the potentials of said floating diffusion and said accumulating capacitive element, and a reset transistor that is connected to said accumulating capacitive element or said floating diffusion to exhaust the photoelectric charge in said accumulating capacitive element and/or said floating diffusion; in this operating method, during the accumulating period of said photoelectric charge, a voltage over that applied on said semiconductor substrate, or –0.6 V or lower than the voltage applied on said semiconductor substrate, is applied as an OFF voltage level of the transistor on the gate electrode of at least one of said transfer transistor, said accumulating transistor and said reset transistor.

In accordance with an aspect of the operating method of a solid-state image pickup device, the solid-state image pickup device has plural pixels integrated in an array configuration on a semiconductor substrate; each pixel has the following parts: a photodiode that receives light and generates and accumulates photoelectric charge, a transfer transistor that transfers said photoelectric charge from said photodiode, a floating diffusion that transfers said photoelectric charge via said transfer transistor, an accumulating capacitive element that is connected via said floating diffusion to said photodiode and at least accumulates the photoelectric charge overflowing from said photodiode in the accumulating operation via said transfer transistor, an accumulating transistor that connects or divides the potentials of said floating diffusion and said accumulating capacitive element, and a reset transistor that is connected to said accumulating capacitive element or said floating diffusion to exhaust the photoelectric charge in said accumulating capacitive element and/or said floating diffusion; in this operating method, during the accumulating period of said photoelectric charge, a voltage over that applied on said semiconductor substrate, or –0.6 V or lower than the voltage applied on said semiconductor substrate, is applied as an OFF voltage level of the transistor on the gate electrode of at least one of said transfer transistor, said accumulating transistor and said reset transistor.

In accordance with an aspect of the operating method of a solid-state image pickup device, during the accumulating period of said photoelectric charge, a voltage over that applied on said semiconductor substrate, or –0.6 V or lower than the voltage applied on said semiconductor substrate, may be applied on the gate electrodes of said transfer transistor, accumulating transistor and reset transistor.

In accordance with an aspect of the aforementioned operating method of a solid-state image pickup device, the voltage applied on said gate electrodes may be 0.3 V or higher than the voltage applied on said semiconductor substrate. The voltage applied on said gate electrodes may be –0.8 V or lower than the voltage applied on said semiconductor substrate.

In accordance with an aspect of the operating method of the solid-state image pickup device of the present invention, the gate electrode of at least one of said transfer transistor, said accumulating transistor and said reset transistor may be made of p-type silicon, and, below said gate electrode made of said p-type silicon, an n-type layer may be formed as a channel on the principal surface of the p-type well of said semiconductor substrate, so that an np-type embedded channel structure is formed.

In accordance with an aspect of the invention, in said photodiode, said transfer transistor, said floating diffusion, said accumulating capacitive element, said accumulating transistor, and said reset transistor, an n-type layer may be formed as a channel on the principal surface of the p-type well of said semiconductor substrate to form an np-type embedded channel structure.

REFERENCE NUMERALS AND SYMBOLS AS SHOWN IN THE DRAWINGS

Figure 10:
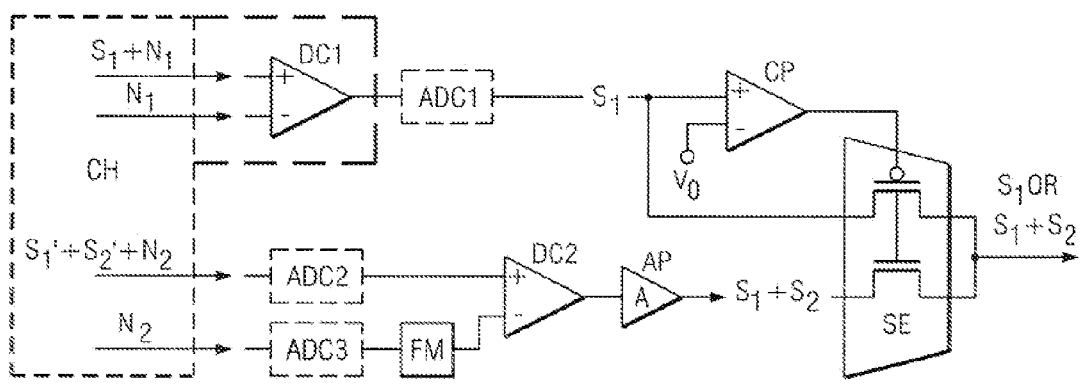
FIG. 10 is a diagram illustrating the circuit for processing of four signals, that is, the pre-saturation charge signal+CFD noise, CFD noise, modulated over-saturation charge signal+CFD+CS noise, and CFD+CS noise.

In the figures 10 represents an n-type semiconductor substrate, 11 a p-type well, 12 a p+-type separating region, 13 an n-type semiconductor region, 14, 17 p+-type semiconductor regions, 15, 16 n+-type semiconductor regions, 15a p-type layer, 20, 21, 22 element-separating insulating films, 23, 24 gate insulating films, 25 a capacitive insulating film, 30, 31 gate electrodes, 32 an upper electrode, 33, 34 wiring, 50 a p-type layer, 51 an n-type layer, 60 a p-type layer, 6, 61 element-separating insulating films, 62 a p-type layer, 63 an n-type contact layer, 64 a silicide layer, ADC1-3 A/D converters, AP an amplifier, CFD, CPD, C capacitances, CS an accumulating capacitive element, CH a chip, CP a comparator, CTa, CTb circuits, DC1, DC2 differential amplifiers, FD a floating diffusion, FM a frame memory, GND a ground, LT a light, N1 a signal of reset level of CFD (noise), N2 represents a signal of reset level of CFD+CS (noise), Noise represents noise, out an output (line), PD a photodiode, Pixel represents a pixel, QA an over-saturation charge, QA1, QA2 portions of over-saturation charge, QB a pre-saturation charge, S1 a pre-saturation charge signal, S1' represents a modulated pre-saturation charge signal, S2 an over-saturation charge signal, S2' a modulated over-saturation charge signal, SE a selector, SL a selection line, SRH a column-shift register. SRV a row-shift register, T1-T4 represents a time, Tr1 a transfer transistor, Tr2 an accumulating transistor, Tr3 a reset transistor, Tr4 an amplifying transistor, Tr5 a selecting transistor, VDD a power source voltage and, φT, φS, φR, φx, φS1+N1, φN1, φS1'+S2'+N2, φN2, φV1, φV2 driving lines.

DESCRIPTION OF THE EMBODIMENTS

For the solid-state image pickup device of the present invention, a solid-state image pickup device with a wide dynamic range, during the accumulating period of said photoelectric charge, a voltage over that applied on said semiconductor substrate, or −0.6 V or lower than the voltage applied on said semiconductor substrate, is applied as an OFF voltage level on the gate electrode of at least one of said transfer transistor, said accumulating transistor and said reset transistor, so that it is possible to suppress the dark current component than the photoelectrons overflowing from the photodiode.

For the operating method of the solid-state image pickup device of the present invention, a solid-state image pickup device with a wide dynamic range, during the accumulating period of said photoelectric charge, a voltage over that applied on said semiconductor substrate, or −0.6 V or lower than the voltage applied on said semiconductor substrate, is applied as an OFF voltage level on the gate electrode of at least one of said transfer transistor, said accumulating transistor and said reset transistor, so that it is possible to suppress the dark current component than the photoelectrons overflowing from the photodiode.

In the following, an explanation will be given regarding embodiments of the solid-state image pickup device and its operating method with reference to figures.

Figure 1:
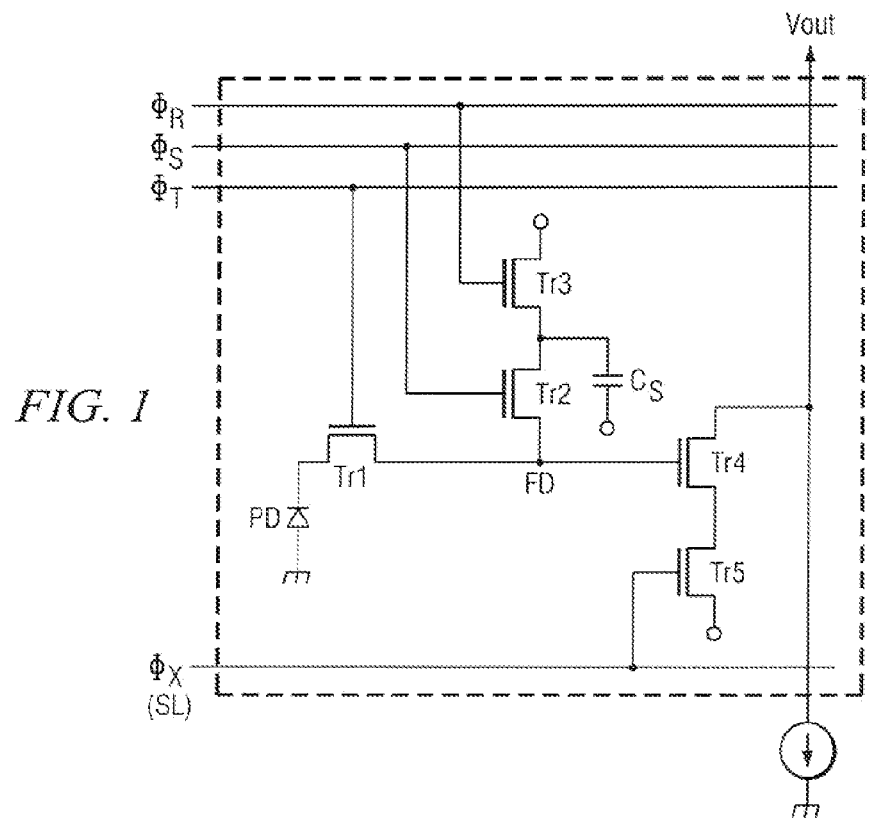
FIG. 1 is an equivalent circuit diagram illustrating one pixel portion of the CMOS image sensor pertaining to Embodiment 1 of the present invention.

The solid-state image pickup device in this embodiment is a CMOS image sensor, and FIG. 1 is an equivalent circuit diagram of a pixel. Each pixel has the following parts: photodiode PD that receives light and generates and accumulates photoelectric charge, transfer transistor Tr1 that transfers said photoelectric charge from said photodiode PD, floating diffusion FD that transfers said photoelectric charge via said transfer transistor, accumulating capacitive element CS that is connected via said floating diffusion to said photodiode and at least accumulates the photoelectric charge overflowing from said photodiode in the accumulating operation via said transfer transistor, accumulating transistor Tr2 that connects or divides the potentials of said floating diffusion FD and said accumulating capacitive element CS, reset transistor Tr3 for exhausting the photoelectric charge in floating diffusion FD, amplifying transistor Tr4 that amplifies the photoelectric charge in said floating diffusion FD and converts it to a voltage signal, and selecting transistor Tr5 that is formed connected to the amplifying transistor and is for selecting a pixel. That is, it is a so-called 5-transistor type CMOS image sensor. For example, all of said five transistors may be n-channel MOS transistors.

The CMOS image sensor in the present embodiment has plural pixels each having said constitution integrated to each other. For each pixel, driving lines φT, φS, φR are connected to the gate electrodes of said transfer transistor Tr1, accumulating transistor Tr2 and reset transistor Tr3, respectively. Also, pixel-selecting line SL (φX) driven by a row-shift register is connected to the gate electrode of selecting transistor Tr5, output line Vout is connected to the output side source/drain of amplifying transistor Tr4, and a voltage signal controlled by the row-shift register is output. Regarding selecting transistor Tr5 and driving line φX, because the voltage of floating diffusion FD may be fixed at a appropriate value so that a pixel selection/nonselection operation can be performed, they may be omitted.

Figure 2:
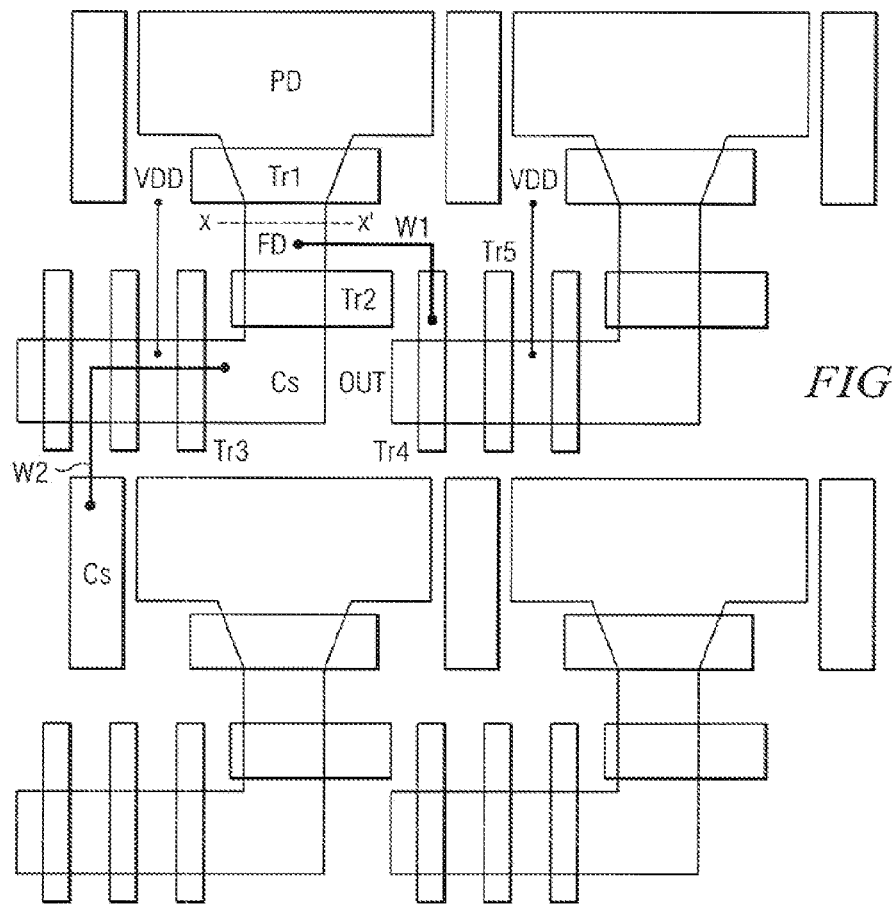
FIG. 2 is a diagram illustrating an example of the layout of approximately 1 pixel when a planar-type accumulating capacitive element is adopted for the CMOS image sensor in Embodiment 1 of the present invention.

FIG. 2 is a diagram illustrating an example of the layout of a pixel (pixel) adopting a planar-type accumulating capacitive element in the CMOS solid-state image pickup device in this embodiment. Said photodiode PD, accumulating capacitive element CS, and five transistors Tr1-Tr5 are connected as shown in the figure. Also, floating diffusion FD between said transfer transistor Tr1 and accumulating transistor Tr2 and the gate of amplifying transistor Tr4 are connected by wiring W1, and the diffusion layer between accumulating transistor Tr2 and reset transistor Tr3 and the upper electrode of accumulating capacitive element CS are connected by wiring W2. In this way, a circuit corresponding to the equivalent circuit diagram of this embodiment shown in FIG. 1 can be realized.

In this layout, the width of the channel of transfer transistor Tr1 is formed such that it is wider on the side of photodiode PD and it is narrower on the side of floating diffusion FD. As a result, charge overflowing from the photodiode can overflow at a high efficiency to the side of the floating diffusion. On the other hand, since it is narrower on the side of floating diffusion FD, the capacitance of floating diffusion FD can be reduced, so that the range of variation in potential than the charge accumulated in floating diffusion FD can be larger.

Figure 3:
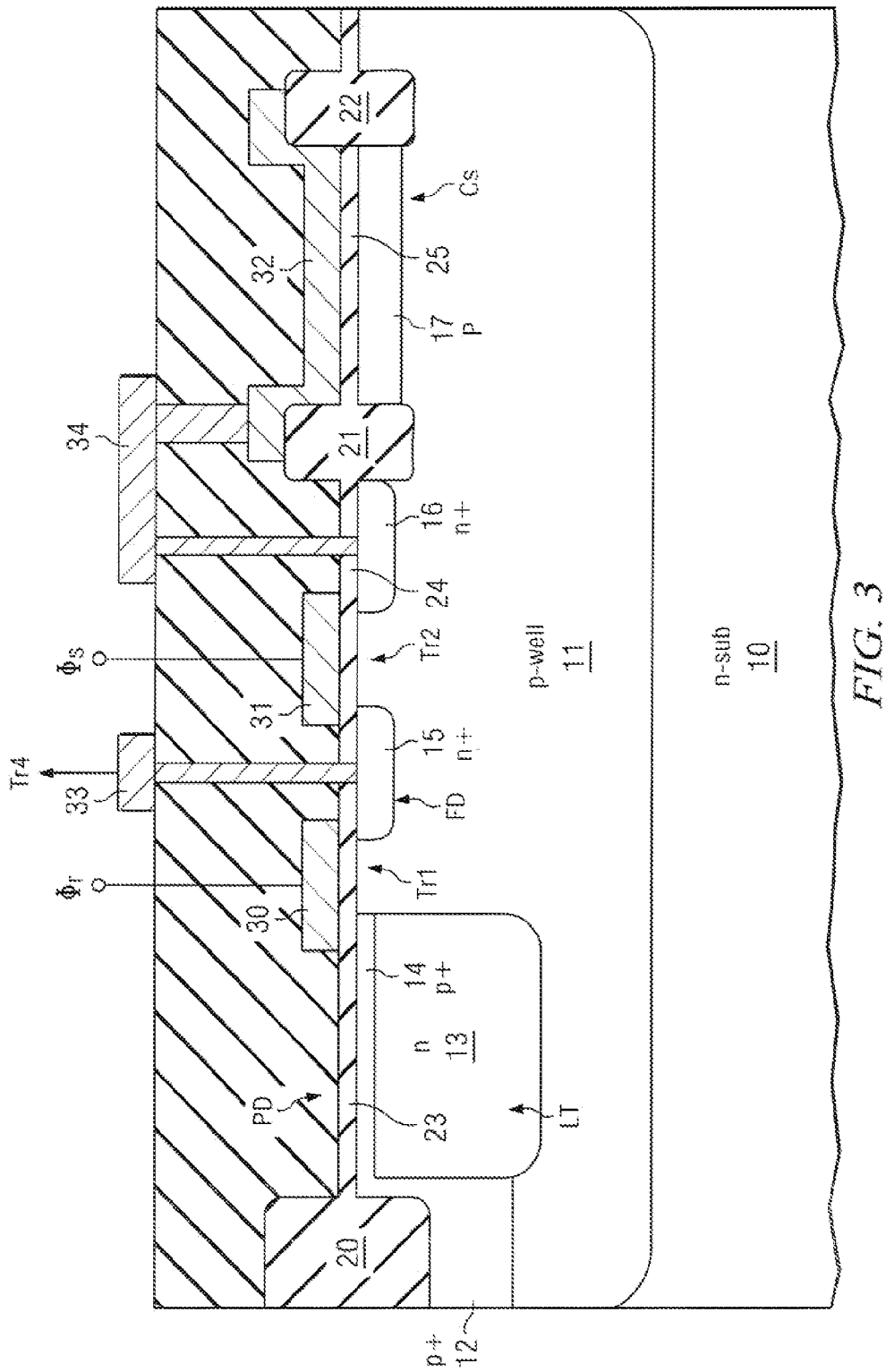
FIG. 3 is a schematic cross-sectional view illustrating a portion of a pixel of the CMOS image sensor pertaining to Embodiment 1 of the present invention.

FIG. 3 is a schematic cross-sectional view illustrating a portion of each pixel of the CMOS image sensor in the present embodiment (photodiode PD, transfer transistor Tr1, floating diffusion FD, accumulating transistor Tr2 and accumulating capacitive element CS). For example, on n-type silicon semiconductor substrate (n-sub) 10, p-type well (p-well) 11 is formed, element-separating insulating films 20, 21, 22 are formed using a LOCOS method that divides the regions of the various elements and accumulating capacitive elements CS, and p+-type separating region 12 is formed in p-type well 11 corresponding to the area below element-separating insulating film 20 that separates pixels.

In p-type well 11, n-type semiconductor region 13 is formed. In its surface layer, p+-type semiconductor region 14 is formed. By means of this pn junction, photodiode PD of the charge transfer embedding type is formed. When light LT is incident on the depletion layer generated while an appropriate bias is applied on the pn junction, photoelectric charge is generated due to the photoelectric effect.

In the end portion of n-type semiconductor region 13, there is a region formed by protruding p+-type semiconductor region 14, and, on the outer layer of p-type well 11 and at a site separated by a prescribed distance from said region, n+-type semiconductor region 15 is formed as floating diffusion FD, and, at a site separated by a prescribed distance from this region, n+-type semiconductor region 16 is formed in the outer layer of p-type well 11.

Here, in the region pertaining to n-type semiconductor region 13 and n+-type semiconductor region 15, gate electrode 30 is formed from silicon or the like via gate insulating film 23 made of silicon oxide or the like on the upper surface of p-type well 11. With n-type semiconductor region 13 and n+-type semiconductor region 15 as source and drain, transfer transistor Tr1 having a channel-forming region on the outer layer of p-type well 11 is formed.

In the region pertaining to n+-type semiconductor region 15 and n+-type semiconductor region 16, gate electrode 31 made of polysilicon or the like is formed via gate insulating film 24 made of silicon oxide or the like on the upper surface of p-type well 11. With n+-type semiconductor region 15 and n+-type semiconductor region 16 as source and drain, accumulating transistor Tr2 having a channel-forming region in the outer layer of p-type well 11 is formed.

Also, in the region divided by element-separating insulating films 21, 22, p+-type semiconductor region 17 is formed as the lower electrode in the outer layer of p-type well 11. On its upper layer, upper electrode 32 made of polysilicon or the like is formed via capacitive insulating film 25 made of silicon oxide or the like, and these parts form accumulating capacitive element CS.

An insulating film made of silicon oxide is formed to cover transfer transistor Tr1, accumulating transistor Tr2, and accumulating capacitive element CS. Opening portions are formed to reach n+-type semiconductor region 15, n+-type semiconductor region 16 and upper electrode 32, and wiring 33 connected to n+-type semiconductor region 15 and wiring 34 connected to n+-type semiconductor region 16 and upper electrode 32 are formed, respectively. Also, driving line φT is formed connected to gate electrode 30 of transfer transistor Tr1, and driving line φS is formed connected to gate electrode 31 of accumulating transistor Tr2.

Other elements, that is, reset transistor Tr3, amplifying transistor Tr4, selecting transistor Tr5, driving lines φT, φS, φR, φX, and output line (out) are present. They are formed in regions not shown in the figure on semiconductor substrate 10 shown in FIG. 3 so as to form the equivalent circuit shown in FIG. 1.

Figure 4:
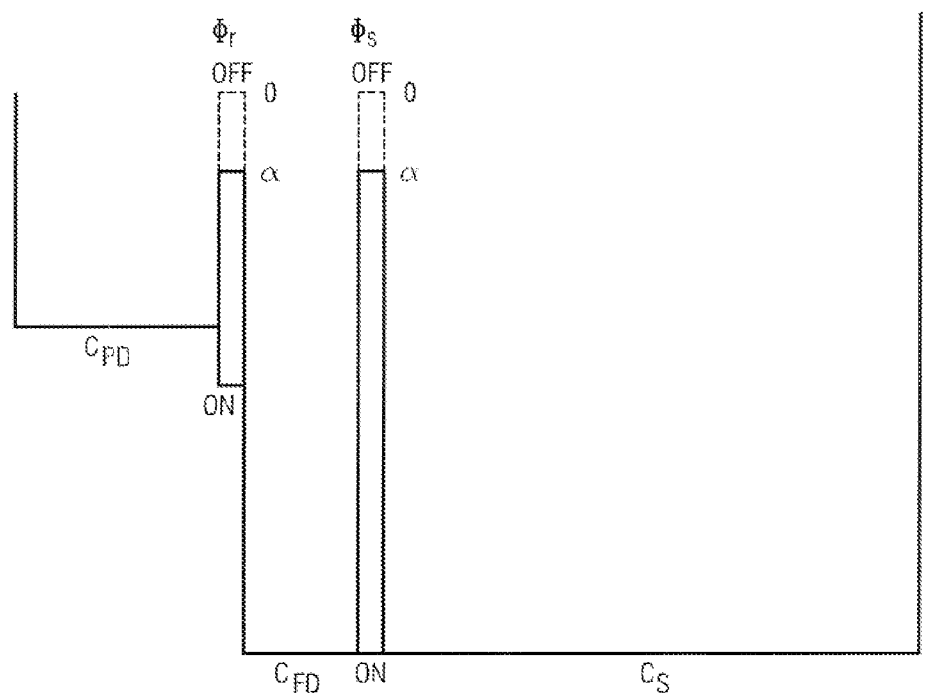
FIG. 4 is a schematic potential diagram corresponding to the photodiodes–accumulating capacitive elements of the CMOS image sensor pertaining to Embodiment 1 of the present invention.

FIG. 4 is a schematic potential diagram corresponding to said photodiode PD, transfer transistor Tr1, floating diffusion FD, accumulating transistor Tr2 and accumulating capacitive element CS. Photodiode PD forms capacitance CPD with a relatively shallow potential, and floating diffusion FD and accumulating capacitive element CS form capacitances (CFD, CS) with a relatively deep potential. Here, transfer transistor Tr1 and accumulating transistor Tr2 take the two levels corresponding to ON/OFF of each transistor. As the OFF potential for said transfer transistor Tr1 and accumulating transistor Tr2, a voltage ($\alpha$) over that applied on said semiconductor substrate, or $-0.6$ V or lower than the voltage applied on said semiconductor substrate is applied.

The voltage applied on the gate electrode be 0.4 V or higher than the voltage applied on the semiconductor substrate. For example, when ground potential is applied on the semiconductor substrate as normal, one may have $\alpha=+0.3$ V. Also, the voltage applied on the gate electrode is a voltage that is $-0.8$ V or lower than the voltage applied on the semiconductor substrate.

Figure 5:
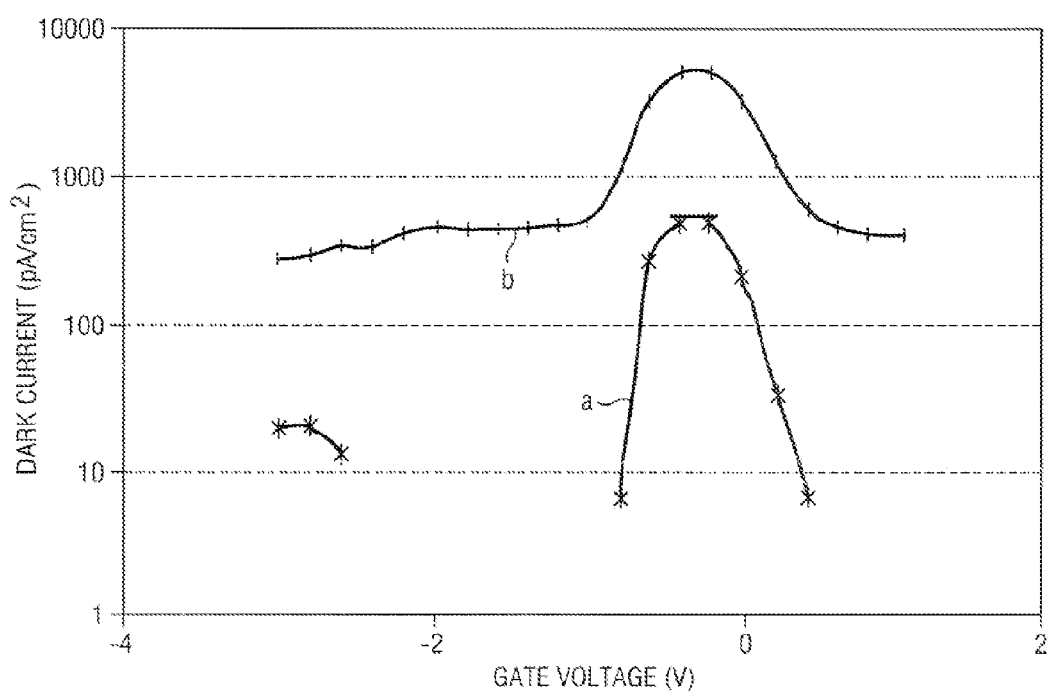
FIG. 5 is a diagram illustrating the experimental results of measurement of the dark current (pA/cm2) versus gate voltage (V) in the transfer transistor of the CMOS image sensor in Embodiment 1.

FIG. 5 is a plot of experimental results obtained in measurement of the dark current (pA/cm2) versus gate voltage (V) of transfer transistor Tr1. In the figure, curve (a) represents the results of measurement at 60° C., and curve (b) represents the results of measurement at 75° C. In the experiment, measurement is performed with the substrate potential at 0 V. As shown in FIG. 5, when the gate potential is set at voltage over that applied on said semiconductor substrate, or $-0.6$ V or lower than the voltage applied on said semiconductor substrate, it is possible to suppress the dark current. Especially, when the gate potential is about $+0.2$ V or about $-0.7$ V, the dark current is only about 1/10 of that when the gate voltage is set at 0 V, the same as the substrate potential. When set higher than 0.3 V or lower than $-0.8$ V, the dark current can be further suppressed to an even smaller value. The results shown in FIG. 5 are those of measurement for transfer transistor Tr1. The same results are obtained for accumulating transistor Tr2.

As explained above, during the accumulating period of said photoelectric charge, as the OFF potential of transfer transistor Tr1 and accumulating transistor Tr2, voltage ($\alpha$) over that applied on said semiconductor substrate, or $-0.6$ V or lower than the voltage applied on said semiconductor substrate, is applied so that it is possible to suppress the dark current component than the photoelectrons overflowing from the photodiode during the accumulating period of said photoelectric charge. In addition, since the dark current generated below reset transistor Tr3 flows into the side of the accumulating capacitive element, for transfer transistor Tr1 and accumulating transistor Tr2, too, voltage (a) over that applied on said semiconductor substrate, or $-0.6$ V or lower than the voltage applied on said semiconductor substrate, is applied as an OFF voltage level to suppress dark current.

In an embodiment of the invention, during the accumulating period of said photoelectric charge, voltage ($\alpha$) over that applied on said semiconductor substrate, or −0.6 V or lower than the voltage applied on said semiconductor substrate, is applied on the gate electrodes of said transfer transistor, said accumulating transistor and said reset transistor. Also, if voltage ($\alpha$) over that applied on said semiconductor substrate, or −0.6 V or lower than the voltage applied on said semiconductor substrate as the OFF potential is applied on one of the gate electrodes of said transfer transistor, said accumulating transistor and said reset transistor, it is possible to suppress the dark current, and the effect of the present invention can be displayed.

In the following, an explanation will be given regarding the driving method of the CMOS image sensor in the present embodiment with reference to the equivalent circuit diagram shown in FIG. 1 and the potential diagram shown in FIG. 4.

Figure 6:
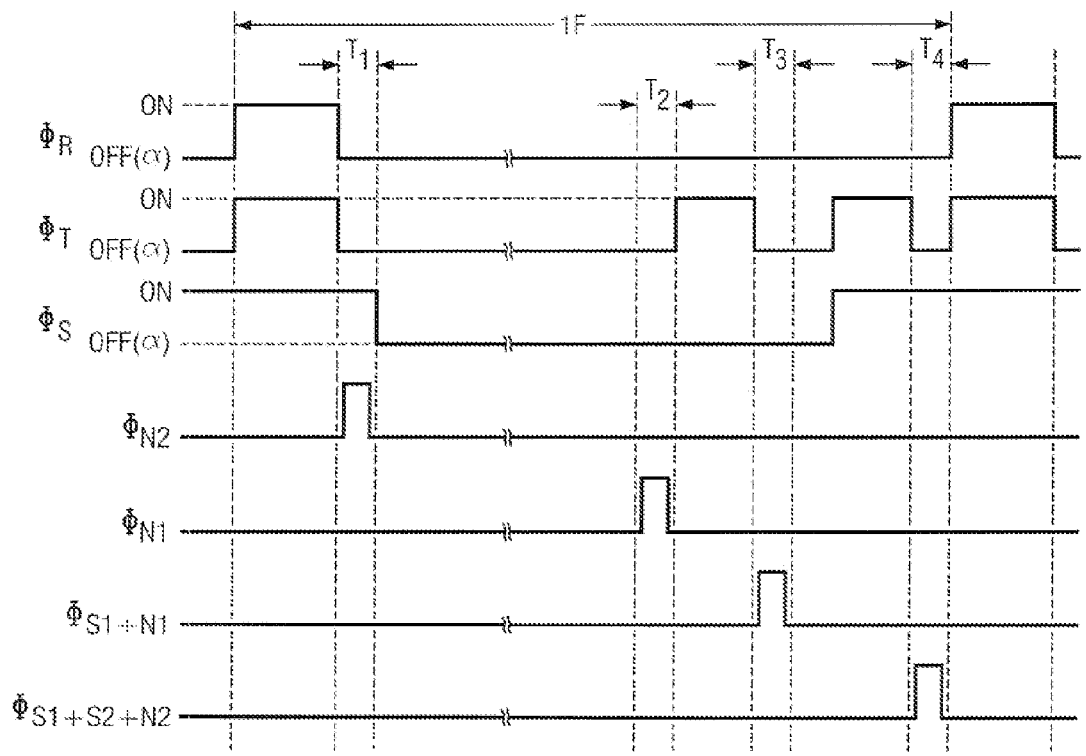
FIG. 6 is a time chart illustrating the two levels of ON/OFF of the voltage applied on the driving line of the CMOS image sensor pertaining to Embodiment 1.

FIG. 6 is a time chart illustrating the ON/OFF 2-level state of the voltage applied on driving lines $\phi$T, $\phi$S, $\phi$R. Here, each OFF potential is said voltage (a) over that applied on said semiconductor substrate, or −0.6 V or lower than the voltage applied on said semiconductor substrate. More specifically, one may have $\alpha$=+0.3 V. Also, FIGS. 7(A)-(C) and FIGS. 8(D)-(F) correspond to potential diagrams in the various timing states of the time chart.

Figure 7A:
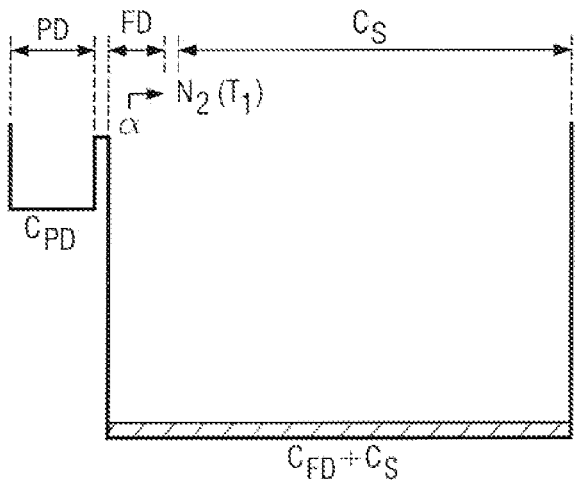
FIGS. 7(A)-(C) are schematic potential diagrams corresponding to the photodiode~accumulating capacitive elements of the CMOS image sensor in Embodiment 1.
Figure 9A:
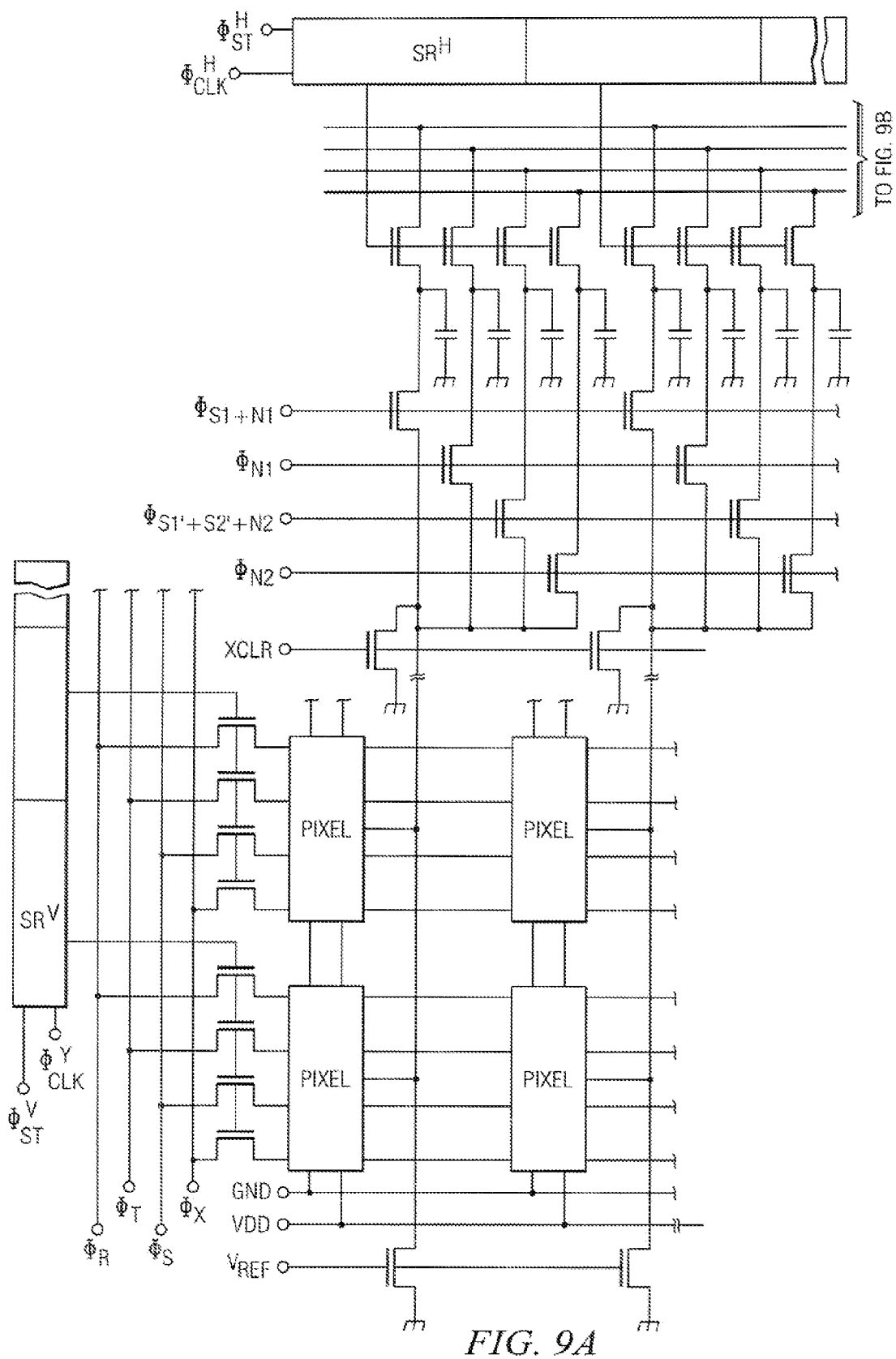
FIG. 9 is an equivalent circuit diagram illustrating the entire circuit constitution of the CMOS image sensor in Embodiment 1 of the present invention.
Figure 9B:
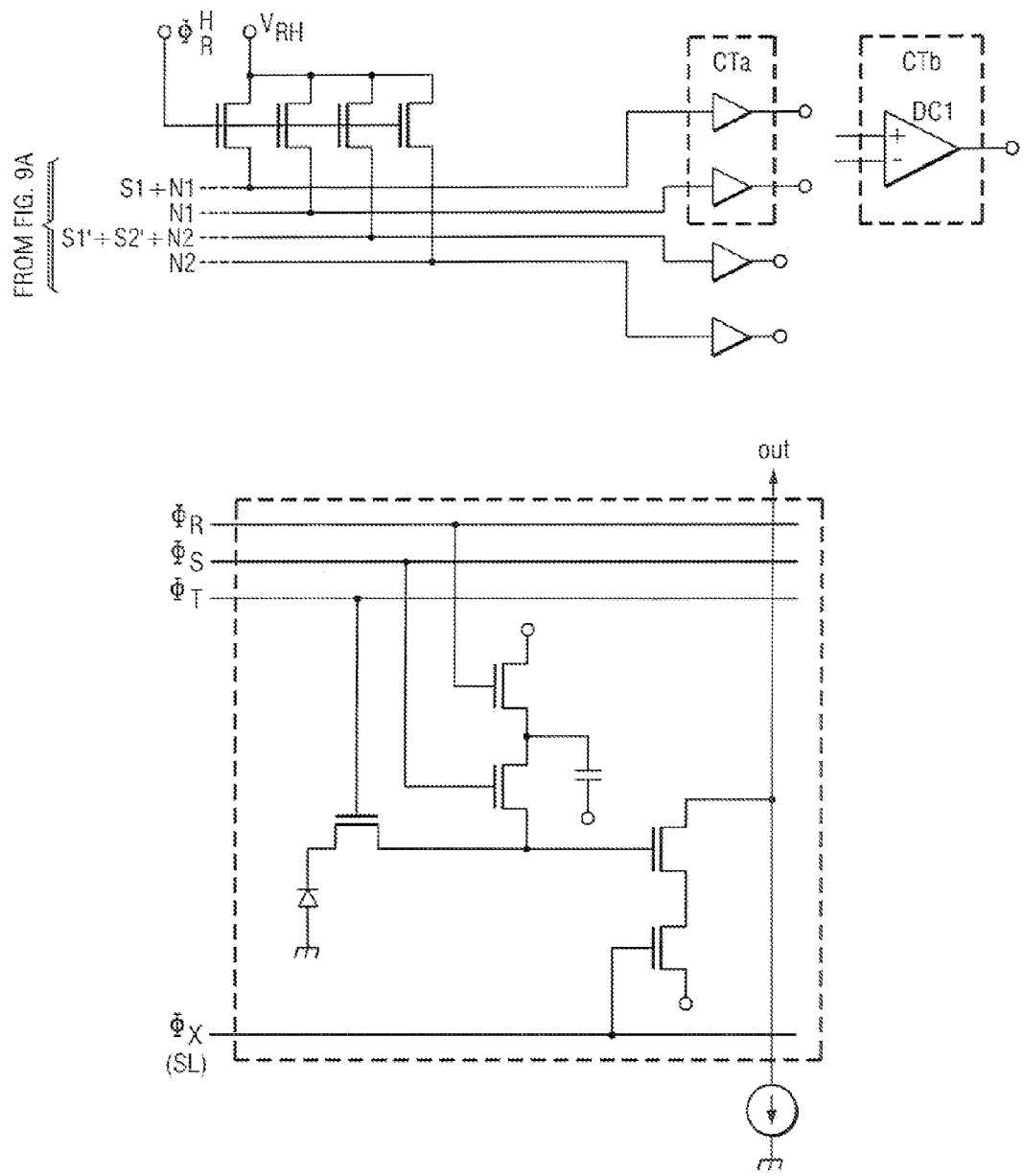

First of all, at the start of one field 1F, while $\phi$S is ON, $\phi$T, $\phi$R are ON, the photoelectric charge generated in the preceding field is entirely exhausted and reset, and, at time T1, $\phi$R is turned OFF ($\alpha$), and accumulation of photoelectric charge is started. In this case, as shown in FIG. 7(A), since $\phi$S is turned ON, CFD and CS are connected to each other, and, immediately after reset, in consideration of the reset operation, a so-called kTC noise is generated at CFD+CS. Here, as to be explained later, $\phi$N2 in FIG. 9 is turned ON, and the signal on reset level of this CFD+CS is read as noise N2. Immediately after read of noise N2, $\phi$S is turned OFF ($\alpha$).

Figure 7B:
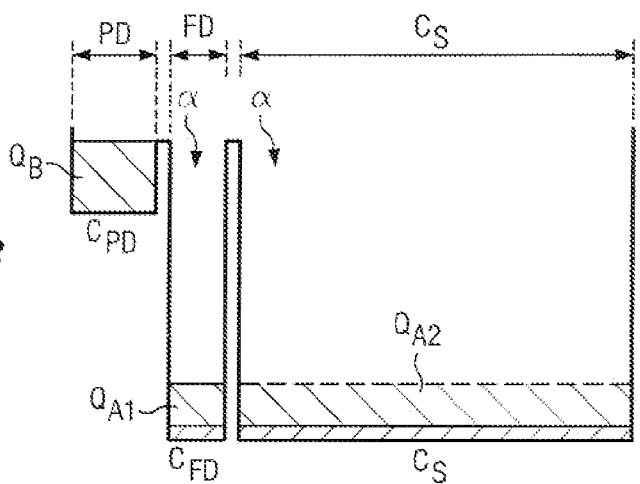

During the accumulating time started when $\phi$R is changed to OFF ($\alpha$), the photoelectric charge generated in photodiode PD accumulates. In this case, the potential of OFF ($\alpha$) of $\phi$T and $\phi$S is taken as the potential over the voltage applied on the semiconductor substrate, such as +0.3 V or the like, so that the barrier between CPD and CFD and the barrier between CFD and CS fall slightly. When accumulation of charge is started, while photoelectric charge is first accumulated in CPD, when photoelectrons exceed the quantity for saturating CPD, as shown in FIG. 7(B), the barrier caused by OFF (a) potential of $\phi$T is overcome, and is accumulation occurs in CFD. In addition, when photoelectric charge is first accumulated in CFD and its quantity exceeds the level for saturating CFD, the barrier caused by OFF (a) potential of $\phi$S is overcome and accumulation occurs in CS.

As explained above, the photoelectric charge overflowing from CPD is selectively accumulated in CFD+CS of the pixel. In this way, when the quantity of photoelectrons is less than that for saturating photodiode PD, the photoelectric charge accumulates only in CPD, and, when the quantity of photoelectrons is over that for saturating photodiode PD, in addition to CPD, photoelectric charge also accumulates in CFD as well as CS.

Figure 7C:
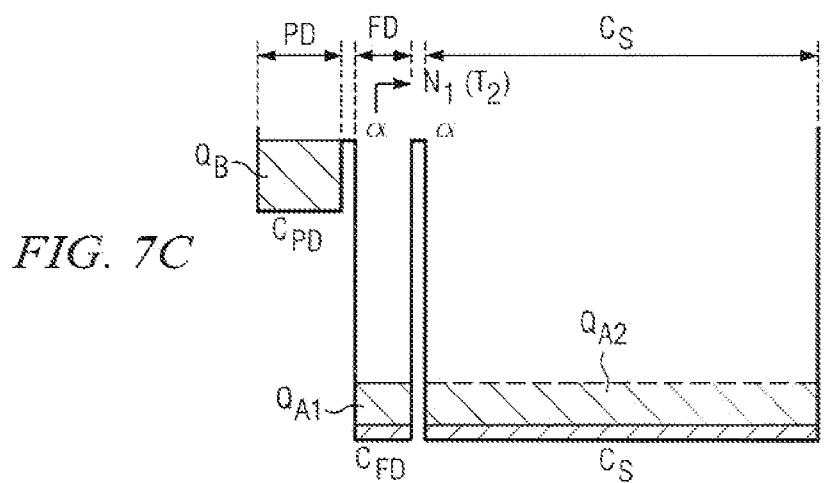

As shown in FIG. 7(B), CPD is saturated, and pre-saturation charge QB accumulates in CPD, over-saturation charge QA1 accumulates in CFD, and, when over-saturation charge QA1 saturates CFD, over-saturation charge QA2 accumulates in CS. Then, at time T2, as shown in FIG. 7(C), $\phi$N1 in FIG. 9 is turned ON, and the signal of the level of CFD that holds a portion QA1 of the over-saturation charge is read as noise N1.

Figure 8D:
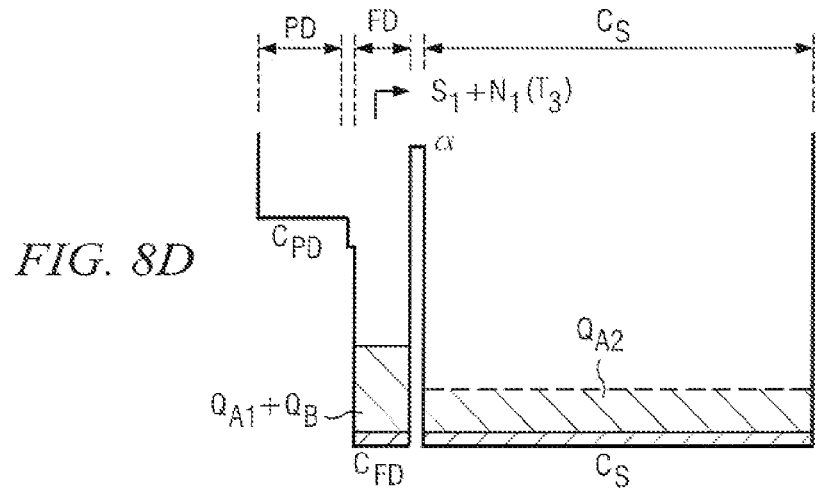
FIGS. 8(D)-(F) are schematic potential diagrams corresponding to the photodiode~accumulating capacitive elements of the CMOS image sensor in Embodiment 1.

Then, as shown in FIG. 8(D), after noise N1 is read out, $\phi$T is turned ON, the pre-saturation charge QB in CPD is transferred to CFD, and it is mixed with a portion QA1 of the over-saturation charge that has been held in CFD. Here, the potential of CPD is shallower than CFD, and the level of the transfer transistor is deeper than CPD, all of pre-saturation charge QB in CPD is transferred to CFD. That is, charge transfer is completely realized.

Then, at time T3, $\phi$T is reset to OFF ($\alpha$), $\phi$S1+N1 in FIG. 9 is turned ON, and pre-saturation charge signal S1 is read from pre-saturation charge QB transferred to CFD. However, in CFD, the charge exists as a sum of pre-saturation charge QB and a portion QA1 of the over-saturation charge, and what is actually read is S1+N1. FIG. 8(D) shows the state before $\phi$T is reset to OFF ($\alpha$). Here, when pre-saturation charge QB in CPD is transferred and overflows from CFD, it further overflows and is accumulated in CS.

Figure 8E:
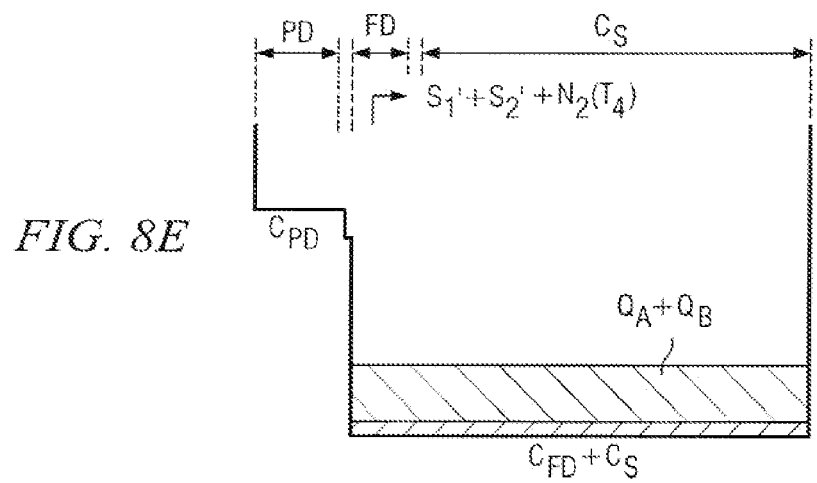
Figure 8F:
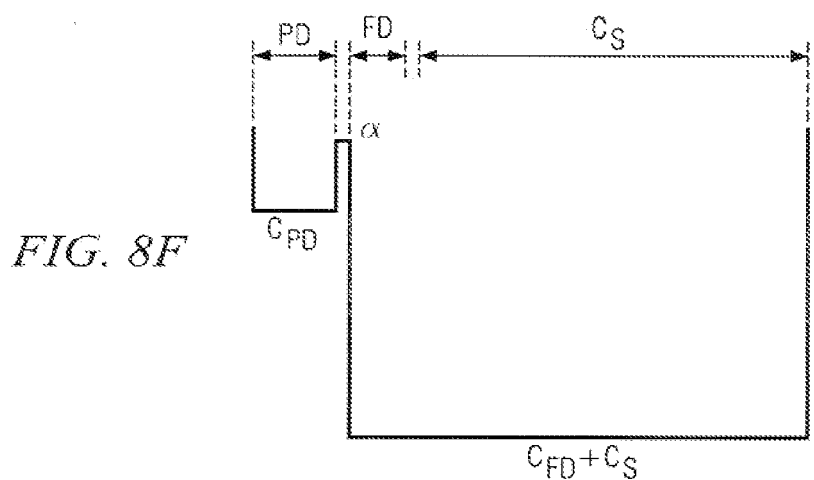

Then, $\phi$S, $\phi$T are turned ON, and the potentials of CFD and CS are coupled to each other. As shown in FIG. 8(E), the charge as the sum of pre-saturation charge QB and a portion QA1 of the over-saturation charge in CFD is mixed with a portion QA2 of the over-saturation charge in CS. As a result, in the potential with CFD and CS coupled to each other, a signal as the sum of pre-saturation charge QB and the total over-saturation charge QA is held.

Here, at time T4, $\phi$T is reset to OFF ($\alpha$). As shown in FIG. 9, $\phi$S1'+S2'+N2 is turned ON, and the signal of the sum of pre-saturation charge signal S1 and over-saturation charge signal S2 is read as pre-saturation charge QB+over-saturation charge QA spread in CFD+CS. Here, however, since CFD+CS noise is included, and reading occurs from the charge spread in CFD+CS, what actually read is S1'+S2'+N2 (where S1' and S2' are values of S1 and S2 that are contracted and modulated according to the ratio of capacitance of CFD to CS). FIG. 8(E) shows the state before $\phi$T is reset to OFF ($\alpha$). In this way, one field 1F comes to an end, and the next field is entered. Then, while $\phi$S is ON, $\phi$T and $\phi$R are turned ON, and, as shown in FIG. 16(F), all of the photoelectric charge generated in the preceding field is exhausted, and then reset occurs.

For the solid-state image pickup device in the present embodiment, voltage ($\alpha$) over that applied on said semiconductor substrate, or −0.6 V or lower than the voltage applied on said semiconductor substrate, is applied as an OFF voltage level on the gate electrode of at least one of said transfer transistor, said accumulating transistor and said reset transistor during the accumulating period of photoelectric charge. It is preferred that a driver also be present for embodiment of the aforementioned voltage application timing.

In the following, an explanation will be given regarding the overall circuit constitution of a CMOS image sensor with pixels of the aforementioned constitution integrated in an array configuration.

FIG. 9 is an equivalent circuit diagram illustrating the entire circuit constitution of the CMOS image sensor in the present embodiment. In this case, plural (four in the example shown in the figure) pixels are set in an array configuration. Driving lines $\phi$T, $\phi$S, $\phi$R, $\phi$X controlled by row-shift register SRV, power source VDD, ground GND, etc., are connected to the various pixels.

From the various pixels, under control of row-shift register SRH and driving lines $\phi$S1+N1, $\phi$N1, $\phi$S1'+S2'+N2, $\phi$N2 as aforementioned, the four values of pre-saturation charge signal (S1)+CFD noise (N1), CFD noise (N1), modulated pre-saturation charge signal (S1')+modulated over-saturation charge signal (S2')+CFD+CS noise (N2), and CFD+CS noise (N2) are output to output lines at respective timings. Here, as will be explained later, for the output terminal position CTa of pre-saturation charge signal (S1)+CFD noise (N1) and CFD noise (N1), after differential is taken, circuit CTb containing differential amplifier DC1 may be formed on the CMOS image sensor chip.

FIG. 10 shows the circuit for processing the four signals, that is, pre-saturation charge signal (S1)+CFD noise (N1), CFD noise (N1), modulated pre-saturation charge signal (S1')+modulated over-saturation charge signal (S2')+CFD+CS noise (N2), and CFD+CS noise (N2). From the aforementioned outputs, pre-saturation charge signal (S1)+CFD noise (N1) and CFD noise (N1) are input to differential amplifier DC1, and, by taking their difference, CFD noise (N1) is cancelled to obtain pre-saturation charge signal (S1). Also, pre-saturation charge signal (S1) may be digitalized by A/D converter ADC1 used as needed, and it may also be left in an analog signal form as is, without using ADC1.

On the other hand, modulated pre-saturation charge signal (S1')+modulated over-saturation charge signal (S2')+CFD+CS noise (N2) and CFD+CS noise (N2) are input to differential amplifier DC2, and, by taking their difference, CFD+CS noise (N2) is cancelled, and the signal is recovered by means of the capacitance ratio of CFD to CS by amplifier AP to adjust the gain just like pre-saturation charge signal (S1) to obtain the sum of the pre-saturation charge signal and over-saturation charge signal (S1+S2). Before inputting to differential amplifier DC2, S1'+S2'N2 signal and N2 signal may be digitalized by A/D converters ADC2 and 3 used as needed, respectively. Also, without using ADC2, 3, they may be input unchanged as analog signals to differential amplifier DC2. Here, as shown in the time chart of FIG. 6, because CFD+CS noise (N2) is acquired before other signals, it is temporarily stored in frame memory FM as a storage means until other signals are acquired, and it is read from frame memory FM at the time of acquisition of the other signals, followed by subsequent processing.

In the following, an explanation will be given regarding recovery of said modulated pre-saturation charge signal (S1')+modulated over-saturation charge signal (S2').

S1', S2', α (charge distribution ratio of CFD to CFD+CS) are represented by the following formulas.

$$S1'=S1\times\square \quad (1)$$

$$S2'=S2\times\square \quad (2)$$

$$\square=CFD/(CFD+CS) \quad (3)$$

Consequently, from the values of CFD and CS, α is determined using above-listed formula (3), and, by substituting it into said formulas (1) and (2), recovery to S1+S2 occurs, and adjustment to the same gain as that of S1 acquired elsewhere is possible. Then, as shown in FIG. 10, either S1 or S1+S2 acquired above is selected to be the final output.

Here, also, S1 is input to comparator CP to be compared with preset reference potential V0. On the other hand, S1 and S1+S2 are input to selector SE, and, corresponding to the output of said comparator CP, either S1 or S1+S2 is selected and output. Reference potential V0 is selected as the potential before saturation corresponding to the capacitance of photodiode PD. For example, it may be about 0.3 V. That is, when the result obtained by subtracting V0 from S1 is negative, that is, when S1 is smaller than V0, it is judged that photodiode PD is not saturated, and S1 is output.

On the contrary, if the result obtained by subtracting V0 from S1 is positive, that is, when S1 is larger than V0, it is judged that photodiode PD is saturated, and S1+S2 is output. For example, the circuit until this output is formed on CMOS image sensor chip CH, and differential amplifier DC1 and the circuit after frame memory FM is externally attached. Also, as explained above, differential amplifier DC1 may also be formed on CMOS image sensor chip CH.

Also, for differential amplifier DC1 and the circuit after frame memory FM, because the handled analog data are large, it is preferred that A/D conversion be performed before input to differential amplifier DC1 and frame memory FM, and that digital processing be performed after differential amplifier DC1 and frame memory FM. In this case, it is preferred that amplification be performed by means of an amplifier not shown in the figure matching the input range of the A/D converter in use.

As explained above, for the CMOS image sensor of the present embodiment, for each pixel, two signals, that is, pre-saturation charge signal (S1) and the sum of pre-saturation charge signal and over-saturation charge signal (S1+S2) are obtained for each field. Judgment is made on whether photodiode PD (CPD) is actually saturated or nearly saturated, and selection is made from S1 and S1+S2.

Figure 11A:
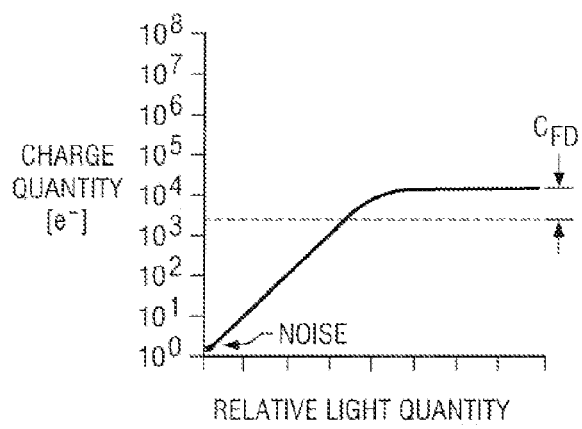
FIGS. 11(A) and 11(B) are diagrams illustrating the charge quantity versus the relative light quantity obtained when capacitance CFD or capacitance CFD+CS is used.
Figure 11B:
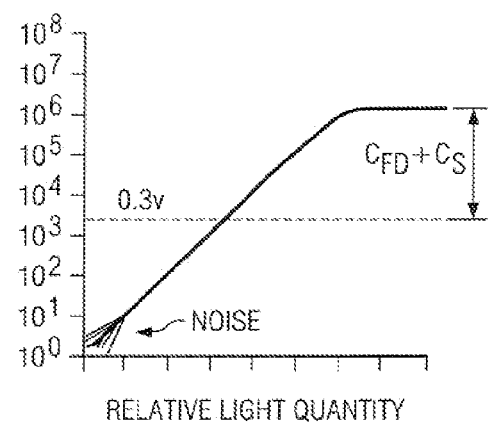

FIG. 11(A) is a diagram illustrating the quantity of charge obtained using capacitance CFD as aforementioned versus the relative light quantity. It corresponds to signal S1. On the other hand, FIG. 11(B) is a diagram illustrating the quantity of charge obtained using capacitance CFD+CS versus the relative light quantity. This corresponds to signal S1+S2.

For example, as reference potential V0 (e.g., 0.3 V), signal S1 shown in FIG. 11(A) is used on the lower illuminance side than it, and signal S1+S2 shown in FIG. 11(B) is used on the higher illuminance side. In this case, in the two graphs, noise appears in the lower illuminance side. However, since signal S1 is smaller than signal S1+S2, and signal S1 is adopted on the lower illuminance side, there is no problem of a high noise level.

Also, for the saturated potential of CFD, dispersion exists for each pixel, and the dispersion in the charge quantity is about $1\times10^4$–$2\times10^4$. However, because switching is made to signal S1+S2 using CFD+CS before entering this region, dispersion in the saturated potential of CFD has no influence. This is an advantage. Also, for example, even when reference potential V0 has dispersion, because the charge quantity of CFD and the charge quantity of CFD+CS agree with each other near the reference potential, at a potential near the reference potential, there is no problem when signal S1 is used or when signal S1+S2 is used.

Figure 11C:
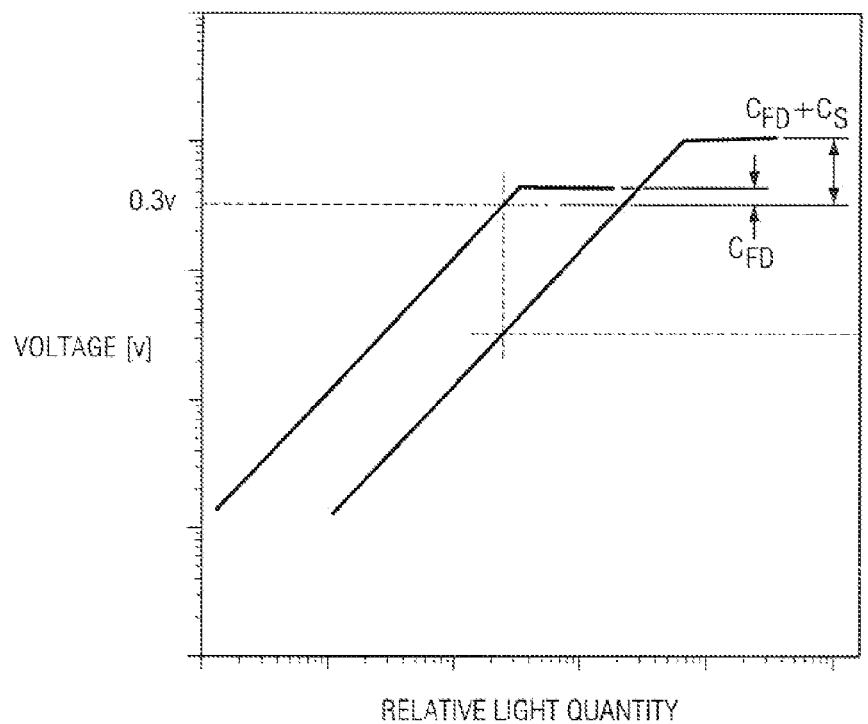
FIG. 11(C) is a diagram illustrating the charge quantities shown in FIGS. 11(A) and 11(B) converted to voltages versus the relative light quantity superimposed on each other.

FIG. 11(C) is a diagram illustrating a plot of the voltage of the floating diffusion when capacitance CFD shown in FIG. 11(A) is used versus the relative light quantity (represented by CFD) and a plot of the voltage of the floating diffusion when capacitance CFD+CS shown in FIG. 11(B) is used versus the relative light quantity (represented by CFD+CS) superimposed on each other. The graphs shown in FIGS. 11(A) and 11(B) correspond to the conversion from charge quantity to voltage.

When capacitance CFD+CS is used, when irradiated with the same light quantity, although the same charge quantity is obtained, because the partial capacitance of CS is larger, the converted voltage is correspondingly lower. For example, signal S1 of the graph represented by CFD is used on the lower illuminance side until the reference potential rises above 0.3 V, and switching to signal S1+S2 of the graph represented by CFD+CS on the higher illuminance side occurs over 0.3 V.

For the CMOS sensor in the present embodiment, in a solid-state image pickup device with a wide dynamic range, during the accumulating period of said photoelectric charge, a voltage over that applied on said semiconductor substrate, or −0.6 V or lower than the voltage applied on said semiconductor substrate, is applied as an OFF voltage level of the transistor on the gate electrode of at least one of said transfer transistor, said accumulating transistor and said reset transistor. With this constitution, it is possible to suppress the dark current component than photoelectrons overflowing from the photodiode.

For the operating method of the CMOS image sensor of the present embodiment, in a solid-state image pickup device with a wide dynamic range, during the accumulating period of said photoelectric charge, a voltage over that applied on said semiconductor substrate, or −0.6 V or lower than the voltage applied on said semiconductor substrate, is applied as an OFF voltage level of the transistor on the gate electrode of at least one of said transfer transistor, said accumulating transistor and said reset transistor. As a result, in the driving, it is possible to suppress the dark current component than photoelectrons overflowing from the photodiode.

Embodiment 2

In Embodiment 1, during the accumulating period of said photoelectric charge, as the OFF voltage level of the transistor, a voltage of −0.6 V or lower than the voltage applied on the semiconductor substrate, is applied on the gate electrode of at least one of said transfer transistor, said accumulating transistor and said reset transistor. For example, if the voltage applied on the semiconductor substrate is the ground potential, a voltage of −0.6 V or lower is applied on the gate electrode.

On the other hand, in the present embodiment, when the voltage applied on the semiconductor substrate is the ground potential, instead of application of a voltage of −0.6 V or lower on the gate electrode, the ground potential is applied on the gate electrode, and a potential of +0.6 V or higher, such as a voltage in the range of 1-3 V, is applied on the semiconductor substrate.

Since generation of dark current depends on the relative potential of the semiconductor substrate and the gate electrode, even when the aforementioned negative potential is integrated in the circuit, just as in Embodiment 1, it is possible to suppress the dark current component than photoelectrons overflowing from the photodiode. This is the effect of this embodiment.

Embodiment 3

Figure 12A:
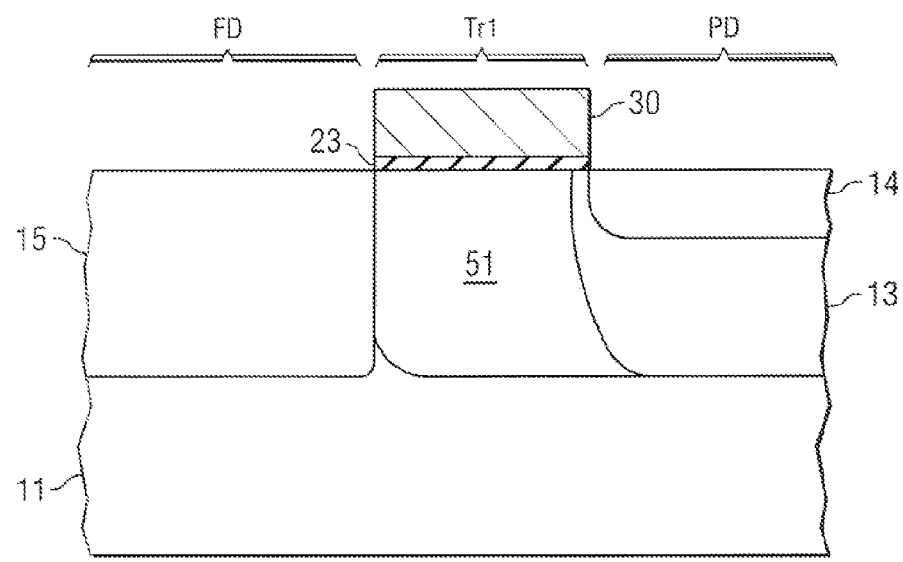
FIGS. 12(A) and (B) are schematic cross-sectional views illustrating the constitution of the photodiode~floating diffusion pertaining to the CMOS sensor in Embodiment 3 of the present invention.

FIGS. 12(A) and (B) are schematic cross-sectional views illustrating the constitution of photodiode PD, transfer transistor Tr1 and floating diffusion FD pertaining to the CMOS sensor in this embodiment.

According to this embodiment, gate electrode 30 of transfer transistor Tr1 is made of P+ polysilicon. As a result, due to the work function of the P+ polysilicon, the effective potential falls by about 1 V, and, just as in Embodiment 1, it is possible to suppress the dark current component for photoelectrons overflowing from the photodiode. This is the effect of the present embodiment.

Figure 12B:
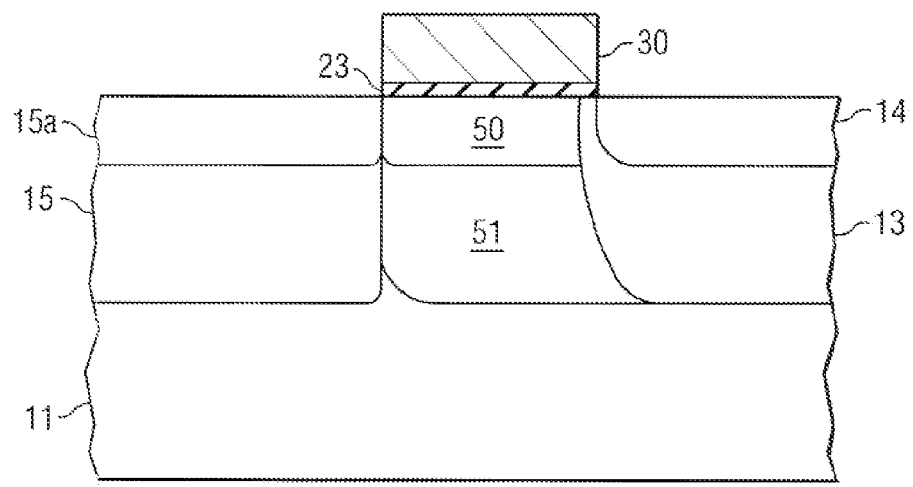
FIG. 12(C) is a potential diagram illustrating the constitution shown in FIGS. 12(A) and (B).

In the case shown in FIG. 12(A), below gate electrode 30, n-type layer 51 is formed as a channel in the surface layer portion to form an np-type embedded channel structure. On the other hand, in the case shown in FIG. 12(B), in order to avoid depletion of the region immediately beneath the gate electrode of the P+ polysilicon, below gate electrode 30, p-type layer 50 is formed in the surface layer portion, and embedding n-type layer 51 is formed as a channel in a region deeper than the p-type layer so as to form a pnp-type junction transistor with an embedded channel structure. Here, also in the surface layer portion of n+-type semiconductor region 15, p-type layer 15a is formed to form a pnp-type junction transistor.

Figure 12C:
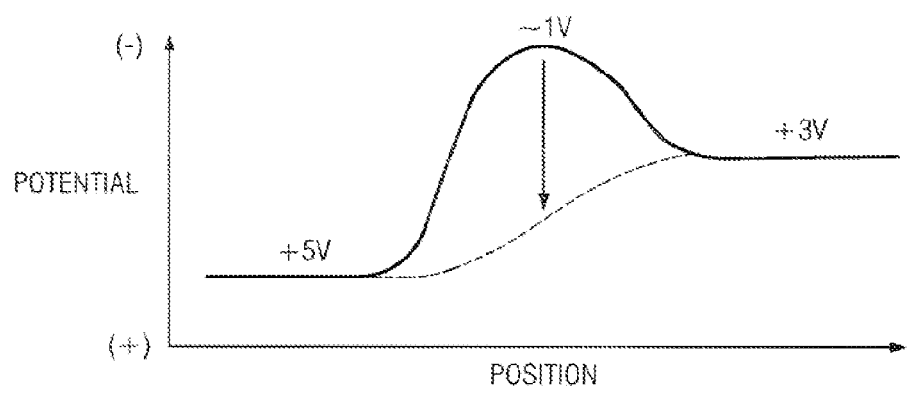

FIG. 12(C) is a potential diagram illustrating the constitution shown in FIGS. 12(A) and (B). For example, when the potential is +3 V for the photodiode region and +5 V for the floating diffusion region, a +1 V barrier is formed in the region below the gate electrode. When voltage is applied on the gate electrode to eliminate the barrier, transfer of photoelectric charge can be performed smoothly. In addition to the transfer transistor, the aforementioned constitution may also be adopted for the accumulating transistor and the reset transistor.

Embodiment 4

Figure 13A:
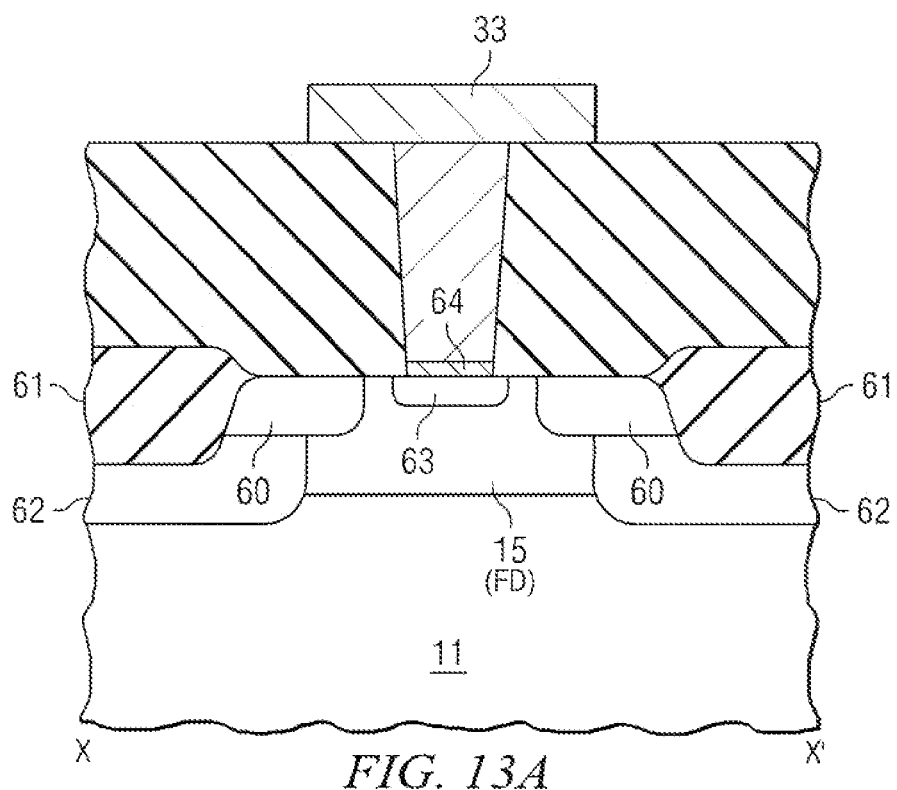
FIG. 13(A) is a cross-sectional view illustrating the floating diffusion portion pertaining to the CMOS sensor in Embodiment 4 of the present invention.

FIG. 13(A) is a cross-sectional view taken across X-X' in FIG. 2. It is a cross-sectional view illustrating the floating diffusion portion pertaining to this embodiment.

For the solid-state image pickup device of the present embodiment, for example, for the photodiode, transfer transistor, floating diffusion, accumulating capacitive element, accumulating transistor, and reset transistor, in p-type well 11 of the semiconductor substrate, p-type layer 60 is formed on the surface, and n+-type semiconductor region 15 is formed as a channel in a region deeper than p-type layer 60, forming a pnp-type embedded channel structure.

For the photodiode, transfer transistor, floating diffusion, accumulating capacitive element, accumulating transistor and reset transistor, an embedded channel structure is adopted, so that charge can move smoothly. Here, LOCOS or another element-separating insulating film 61 for dividing the active region is formed, and p-type layer 62 is formed to cover the side surface of element-separating insulating film 61.

Also, an insulating film made of silicon oxide or the like is formed to cover floating diffusion FD; opening portion connected to n+-type semiconductor region 15 is formed; and n-type contact layer 63 is formed in the region of the opening portion in the surface layer portion of n+-type semiconductor region 15. In addition, on its surface, silicide layer 64 is formed, and wiring 33 is formed connected to an amplifying transistor on the upper layer of the insulating layer that integrates the plug embedded in the contact hole.

Figure 13B:
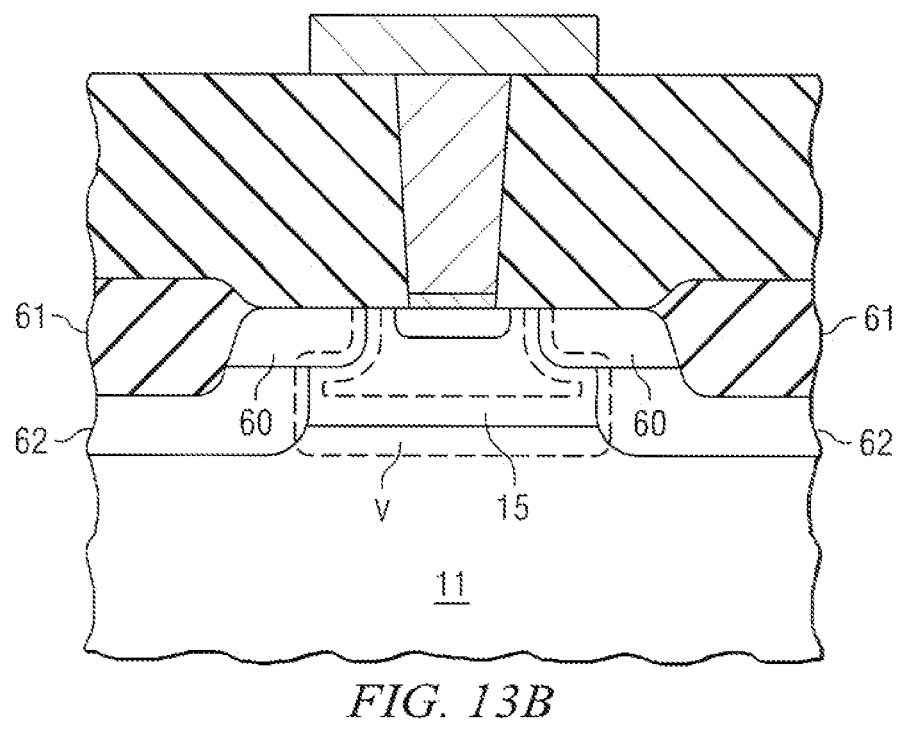
FIG. 13(B) is a schematic diagram illustrating the state of the deletion layer formed in driving in the floating diffusion with the constitution shown in FIG. 13(A).

FIG. 13(B) is a schematic diagram illustrating the state of depletion layer V formed in driving in the floating diffusion with the constitution shown in FIG. 13(A).

It is preferred that the design be executed such that the channel is not depleted when resetting is performed for exhausting the charge in floating diffusion FD and accumulating capacitive element CS. The present invention is not limited to the aforementioned explanation. For example, a case where there are five transistors for the CMOS sensor of each pixel. However, it may also be adopted for a CMOS sensor having more than said number of transistors.

In addition, modifications variations may be adopted as long as the gist of the present invention is observed. The solid-state image pickup device of the present invention can be adopted in image sensors that should have a wide dynamic range, such as a CMOS image sensor, CCD image sensor, etc. carried in digital cameras, camera-attached cell phones, etc. The operating method of the solid-state image pickup device of the present invention may be adopted in the operation of an image sensor that should have a wide dynamic range.

The invention claimed is:

1. A solid-state image pickup device comprising plural pixels integrated in an array configuration on a semiconductor substrate; each pixel comprising the following parts: a photodiode that receives light and generates and accumulates photoelectric charge in the form of photoelectrons; a transfer transistor that transfers said photoelectric charge from said photodiode; a floating diffusion that transfers said photoelectric charge via said transfer transistor; an accumulating capacitive element that is connected via said floating diffusion to said photodiode and at least accumulates the photoelectric charge overflowing from said photodiode in the accumulating operation via said transfer transistor wherein the overflowing charge is integrated by capacitance of the floating diffusion and the accumulating capacitive element thereby increasing dynamic range; an accumulating transistor that connects or divides the potentials of said floating diffusion and said accumulating capacitive element; and a reset transistor that is directly connected to said accumulating capacitive element and not directly connected to said floating diffusion to exhaust the photoelectric charge in of said accumulating capacitive element; during the accumulating period of said photoelectric charge, a voltage over that applied on said semiconductor substrate, or −0.6 V or lower than the voltage applied on said semiconductor substrate, is applied as an OFF voltage level of the transistor on the gate electrode of at least one of said transfer transistor, said accumulating transistor and said reset transistor; and further comprising: gate electrode of at least one of said transfer transistor, said accumulating transistor and said reset transistor is made of p-type polysilicon; below said gate electrode made of p-type polysilicon; a p-type layer is formed on a principal surface of a p-type well of said semiconductor substrate, and an n-type layer is formed as a channel in a region deeper than said p-type layer, so that a pnp-type embedded channel structure is formed.

2. The solid-state image pickup device described in claim 1 wherein during the accumulating period of said photoelectric charge, a voltage over that applied on said semiconductor substrate, or −0.6 V or lower than the voltage applied on said semiconductor substrate, is applied on the gate electrodes of said transfer transistor, accumulating transistor and reset transistor.

3. The solid-state image pickup device described in claim 1 wherein the voltage applied on said gate electrodes is 0.3 V or higher than the voltage applied on said semiconductor substrate.

4. The solid-state image pickup device described in claim 1 wherein the voltage applied on said gate electrodes is −0.8 V or lower than the voltage applied on said semiconductor substrate.

5. The solid-state image pickup device described in claim 1 wherein the gate electrode of at least one of said transfer transistor, said accumulating transistor and said reset transistor is made of p-type silicon, and, below said gate electrode made of said p-type silicon, an n-type layer is formed as a channel on a principal surface of a p-type well of said semiconductor substrate, so that an np-type embedded channel structure is formed.

6. The solid-state image pickup device described in claim 5 wherein in said photodiode, said transfer transistor, said floating diffusion, said accumulating capacitive element, said accumulating transistor, and said reset transistor, an n-type layer is formed as a channel on the principal surface of the p-type well of said semiconductor substrate to form an np-type embedded channel structure.

7. The solid-state image pickup device described in claim 1 wherein in said photodiode, said transfer transistor, said floating diffusion, said accumulating capacitive element, said accumulating transistor, and said reset transistor, a p-type layer is formed on a principal surface of a p-type well of said semiconductor substrate, and, in a region deeper than said p-type layer, an n-type layer is formed as a channel to form a pnp-type embedded channel structure.

8. The solid-state image pickup device described in claim 1 further comprising: a driver that works as follows: on the gate electrode of at least one of said transfer transistor, said accumulating transistor and said reset transistor, during the accumulating period of said photoelectric charge, a voltage over that applied on said semiconductor substrate, or −0.6 V or lower than the voltage applied on said semiconductor substrate, is applied as an OFF voltage level.

9. An operating method of a solid-state image pickup device comprising providing a solid-state image pickup device having plural pixels integrated in an array configuration on a semiconductor substrate, each pixel having the following parts: a photodiode that receives light and generates and accumulates photoelectric charge in the form of photoelectrons, a transfer transistor that transfers said photoelectrons from said photodiode, a floating diffusion that transfers said photoelectrons via said transfer transistor, an accumulating capacitive element that is connected via said floating diffusion to said photodiode and at least accumulates the photoelectrons overflowing from said photodiode in the accumulating operation via said transfer transistor wherein the overflowing charge is integrated by capacitance of the floating diffusion and the accumulating capacitive element thereby increasing dynamic range, an accumulating transistor that connects or divides the potentials of said floating diffusion and said accumulating capacitive element, and a reset transistor that is directly connected to said accumulating capacitive element and not directly connected to said floating diffusion to exhaust the photoelectric charge in said accumulating capacitive element, gate electrode of at least one of said transfer transistor, said accumulating transistor and said reset transistor is made of p-type polysilicon; below said gate electrode made of p-type polysilicon, a p-type layer is formed on a principal surface of a p-type well of said semiconductor substrate, and an n-type layer is formed as a channel in a region deeper than said p-type layer, so that a pnp-type embedded channel structure is formed; during the accumulating period of said photoelectrons, a voltage over that applied on said semiconductor substrate, or −0.6 V or lower than the voltage applied on said semiconductor substrate, is applied as an OFF voltage level of the transistor on the gate electrode of at least one of said transfer transistor, said accumulating transistor and said reset transistor.

10. The operating method of a solid-state image pickup device described in claim 9 wherein that during the accumulating period of said photoelectric charge, a voltage over that applied on said semiconductor substrate, or −0.6 V or lower than the voltage applied on said semiconductor substrate, is applied on the gate electrodes of said transfer transistor, accumulating transistor and reset transistor.

11. The operating method of a solid-state image pickup device described in claim 9 wherein the voltage applied on said gate electrodes is 0.3 V or higher than the voltage applied on said semiconductor substrate.

12. The operating method of the solid-state image pickup device described in claim 9 wherein the voltage applied on said gate electrodes is −0.8 V or lower than the voltage applied on said semiconductor substrate.

* * * * *